United States Patent
Su et al.

(10) Patent No.: US 11,574,585 B1
(45) Date of Patent: Feb. 7, 2023

(54) LIGHT EMITTING UNIT AND DISPLAY APPARATUS

(71) Applicant: PlayNitride Display Co., Ltd., MiaoLi County (TW)

(72) Inventors: Po-Jen Su, MiaoLi County (TW); Gwo-Jiun Sheu, MiaoLi County (TW); Chih-Chiang Lu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/673,813

(22) Filed: Feb. 17, 2022

(30) Foreign Application Priority Data

Dec. 9, 2021 (TW) ................................ 110145986

(51) Int. Cl.
*G09G 3/32* (2016.01)
*H01L 25/075* (2006.01)
*H01L 33/62* (2010.01)

(52) U.S. Cl.
CPC ........... *G09G 3/32* (2013.01); *H01L 25/0753* (2013.01); *H01L 33/62* (2013.01); *G09G 2300/0439* (2013.01); *G09G 2320/0233* (2013.01); *G09G 2320/0242* (2013.01); *G09G 2320/066* (2013.01)

(58) Field of Classification Search
CPC ............. G09G 3/32; G09G 2300/0439; G09G 2320/0233; G09G 2320/0242; G09G 2320/066; H01L 25/0753; H01L 33/62
See application file for complete search history.

(56) References Cited

U.S. PATENT DOCUMENTS

| | | | |
|---|---|---|---|
| 2013/0249892 A1 | 9/2013 | Tsai et al. | |
| 2020/0058247 A1 | 2/2020 | Zhang et al. | |
| 2020/0211163 A1* | 7/2020 | Chien | G09G 3/2003 |
| 2021/0264864 A1* | 8/2021 | Yang | G09G 3/32 |
| 2021/0304673 A1* | 9/2021 | Gao | G09G 3/3233 |
| 2022/0319430 A1* | 10/2022 | Wang | G09G 3/006 |

FOREIGN PATENT DOCUMENTS

| | | |
|---|---|---|
| CN | 108735776 | 11/2018 |
| CN | 109298560 | 2/2019 |
| TW | 201023126 | 6/2010 |

OTHER PUBLICATIONS

"Office Action of Taiwan Counterpart Application", dated Jul. 28, 2022, p. 1-p. 4.

* cited by examiner

*Primary Examiner* — Kenneth B Lee, Jr.
(74) *Attorney, Agent, or Firm* — JCIPRNET

(57) ABSTRACT

A light-emitting unit includes a multilayer circuit structure, a plurality of display pixels, and at least one compensation pixel. The multilayer circuit structure includes a top circuit layer and a bottom circuit layer. The display pixels are arranged into an N×M pixel array along a first direction and a second direction. Each of the display pixels includes a plurality of sub-pixels. The sub-pixels are disposed on the top circuit layer of the multilayer circuit structure. The compensation pixel is disposed on the top circuit layer of the multilayer circuit structure and electrically bonded to the multilayer circuit structure. The compensation pixel is located between the display pixels. The number of the compensation pixel is less than the number of the display pixels. Extension lines in the first direction and the second direction do not pass through the compensation pixel. A display apparatus is also provided.

14 Claims, 8 Drawing Sheets

LIGHT EMITTING UNIT AND DISPLAY APPARATUS

CROSS-REFERENCE TO RELATED APPLICATION

This application claims the priority benefit of Taiwanese application no. 110145986, filed on Dec. 9, 2021. The entirety of the above-mentioned patent application is hereby incorporated by reference herein and made a part of this specification.

BACKGROUND

Technical Field

The disclosure relates to an electronic unit and an electronic device, and particularly relates to a light-emitting unit and a display apparatus adapted for splicing.

Description of Related Art

In recent years, as applications of display apparatuses become widespread, demands by users for the size and the display screen of the display apparatus also gradually increase, and a technology of display apparatuses that can be spliced has been provided. For example, light-emitting elements required by the display apparatus are first transferred onto a plurality of intermediate substrates to form a plurality of light-emitting units. Then, the light-emitting units are transferred onto a target circuit board to complete the display apparatus to meet demands by the users for a large-size display device. When the display apparatus is applied outdoors or in an environment with an excessively bright external light source, the excessive external light intensity often leads to insufficient brightness of the display apparatus or unobvious purity of color lights of the display screen, thus reducing the contrast of the presented display screen and affecting the viewing experience. In addition, various unavoidable process defects during the manufacturing process of the display apparatus may cause an uneven brightness distribution of the display screen when the display apparatus leaves the factory.

SUMMARY

The disclosure provides a light-emitting unit and a display apparatus, which are configured to improve insufficient brightness of the display apparatus, and can provide a high-contrast display screen when the display apparatus serves as an outdoor display apparatus. In addition, a means for compensating for brightness is provided to eliminate uneven brightness of a display panel.

The disclosure provides a light-emitting unit, including a multilayer circuit structure, a plurality of display pixels, and at least one compensation pixel. The multilayer circuit structure includes a top circuit layer and a bottom circuit layer. The bottom circuit layer is disposed opposite to the top circuit layer. The display pixels are arranged into an N×M pixel array along a first direction and a second direction. Each of the display pixels includes a plurality of sub-pixels. The sub-pixels are disposed on the top circuit layer of the multilayer circuit structure. The first direction is not parallel to the second direction. The compensation pixel is disposed on the top circuit layer of the multilayer circuit structure and electrically bonded to the multilayer circuit structure. The compensation pixel is located between the display pixels. The number of the compensation pixel is less than the number of the display pixels. An extension line in the first direction and an extension line in the second direction do not pass through the compensation pixel.

The disclosure provides a display apparatus adapted for splicing, and configured to provide a display image. The display apparatus includes a plurality of light-emitting units and a driving circuit substrate. Adjacent ones of the light-emitting units are connected to each other. Each of the light-emitting units includes a multilayer circuit structure, a plurality of display pixels, and at least one compensation pixel. The multilayer circuit structure includes a top circuit layer and a bottom circuit layer. The bottom circuit layer is disposed opposite to the top circuit layer. The display pixels are arranged into an N×M pixel array along a first direction and a second direction. Each of the display pixels includes a plurality of sub-pixels. The sub-pixels are disposed on the top circuit layer of the multilayer circuit structure. The first direction is not parallel to the second direction. The compensation pixel is disposed on the top circuit layer of the multilayer circuit structure and electrically bonded to the multilayer circuit structure. The compensation pixel is located between the display pixels. The number of the compensation pixel is less than the number of the display pixels. An extension line in the first direction and an extension line in the second direction do not pass through the compensation pixel. The driving circuit substrate is electrically bonded to the bottom circuit layer of the multilayer circuit structure and electrically bonded to the display pixels and the compensation pixel through the multilayer circuit structure. The driving circuit substrate includes at least one driving chip. The driving chip provides a first display signal to the sub-pixels and a second display signal to the compensation pixel.

Based on the foregoing, in the light-emitting unit and the display apparatus of an embodiment of the disclosure, since the compensation pixel provides compensation display light, the display screen can still have good contrast, brightness, and color purity even when the display apparatus is in an environment with an excessively bright external light source. In addition, the difficulty in manufacturing a large-size display apparatus is reduced by the spliced light-emitting units. At the same time, a sense of visual discontinuity of the image is reduced by utilizing the compensation display light emitted by the compensation pixel. Moreover, since the number of compensation pixels is less than the number of display pixels, the complexity of circuit design and the number of used light-emitting elements are accordingly reduced, thus reducing the costs. Furthermore, since the compensation pixel may be individually modulated, the display apparatus can thus adaptively adjust the brightness of the compensation pixel for compensation depending on the environment, so that the bright region of the display screen have a relatively high brightness, accordingly effectively reducing uneven brightness in the display screen.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
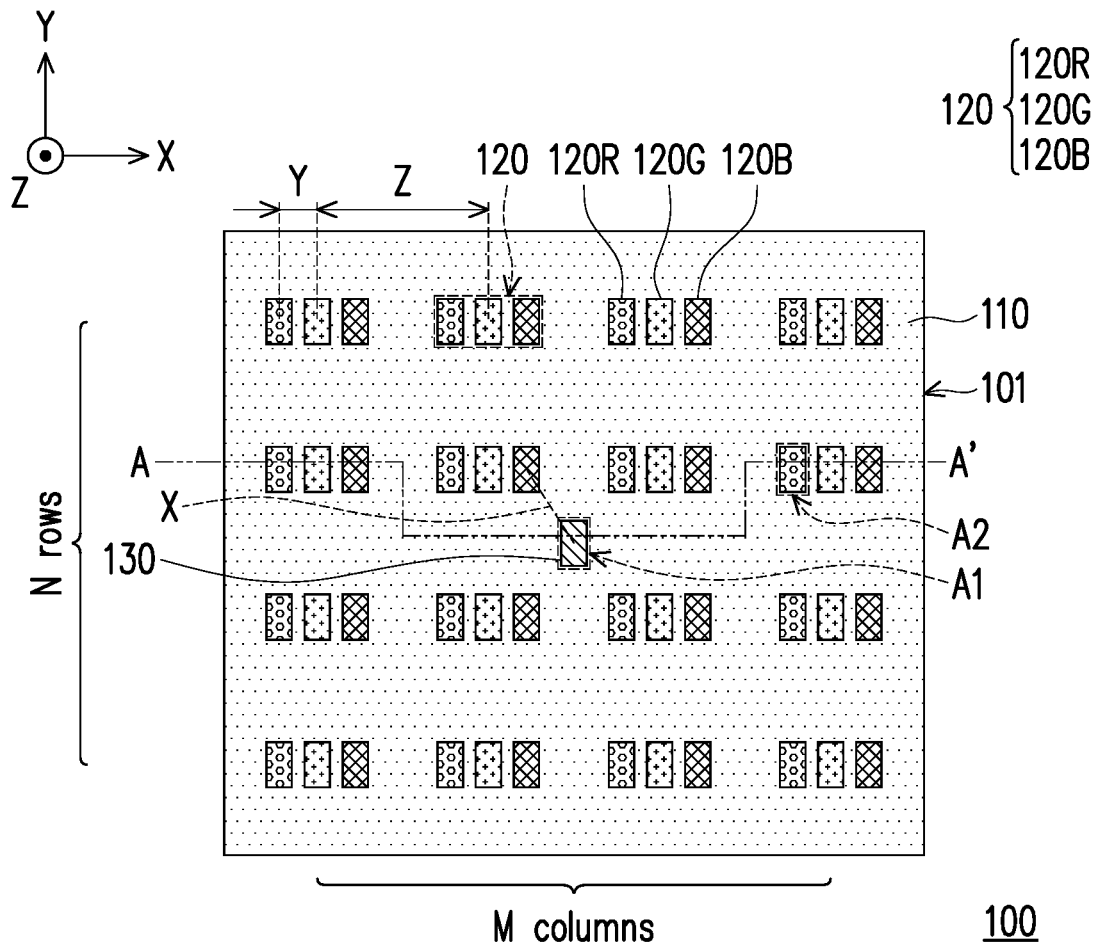
FIG. 1 is a schematic top view of a light-emitting unit according to a first embodiment of the disclosure.
Figure 2:
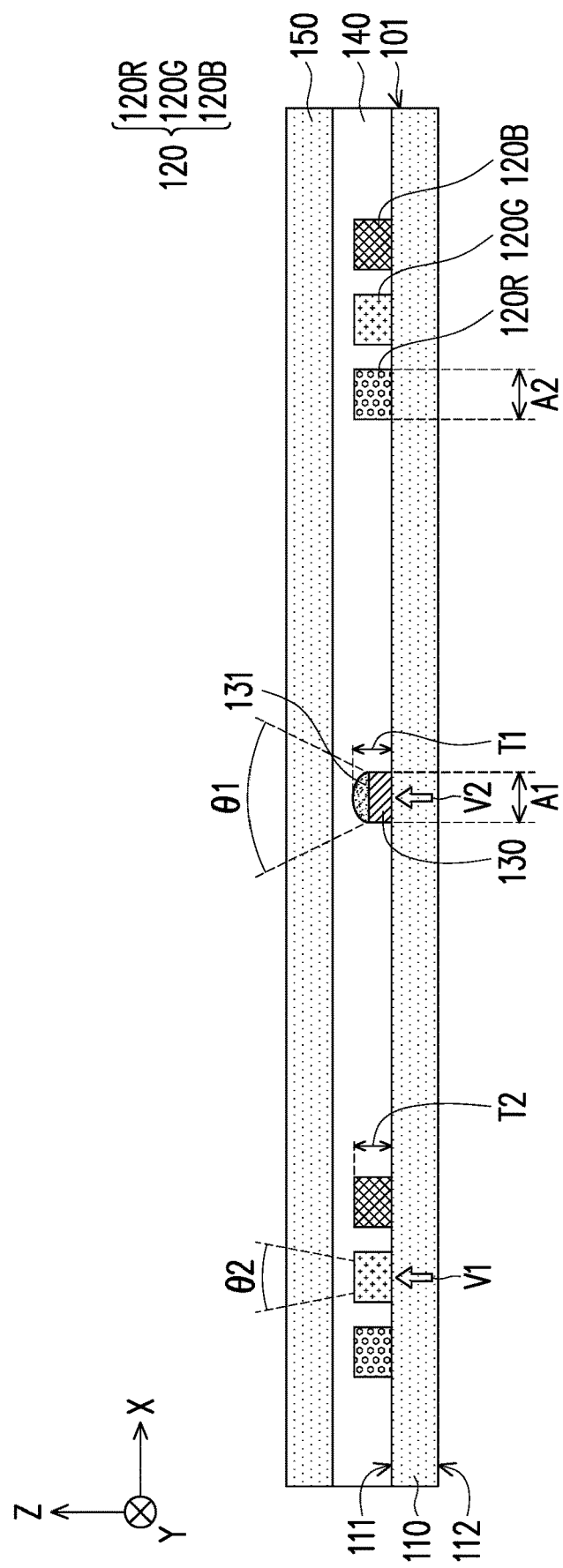
FIG. 2 is a schematic cross-sectional view of the light-emitting unit of FIG. 1.
Figure 8:
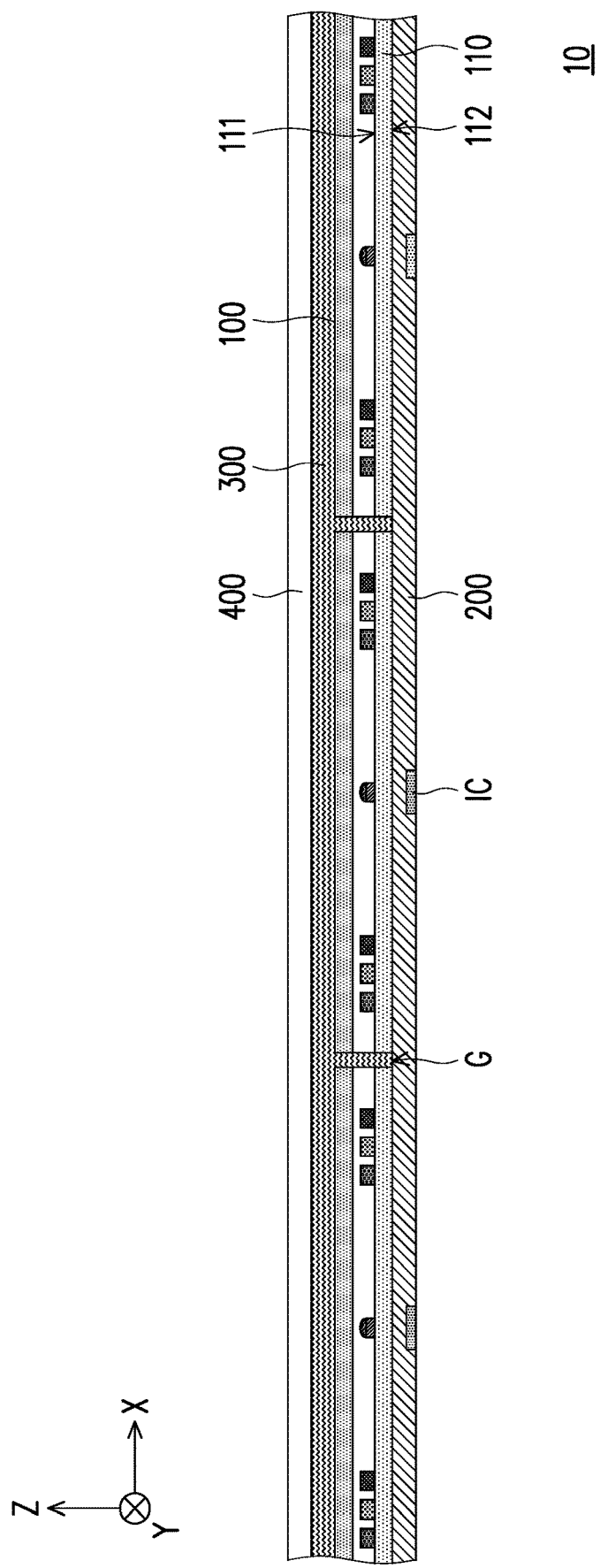
FIG. 8 is a schematic cross-sectional view of a display apparatus formed by splicing the light-emitting units of the disclosure.

FIG. 1 is a schematic top view of a light-emitting unit according to a first embodiment of the disclosure. FIG. 2 is a schematic cross-sectional view of the light-emitting unit of FIG. 1. FIG. 8 is a schematic cross-sectional view of a display apparatus formed by splicing the light-emitting units according to the first embodiment of the disclosure. FIG. 2 corresponds to section line A-A' of FIG. 1. For clarity of presentation, FIG. 1 only illustrates multilayer circuit structure 110, display pixel 120, sub-pixels 120R, 120G, 120B, and compensation pixel 130 of FIG. 2.

With reference to FIG. 1 and FIG. 2, a light-emitting unit 100 includes a multilayer circuit structure 110, a plurality of display pixels 120, a compensation pixel 130, a protective layer 140, and a protective board 150. The display pixels 120 are disposed on a top circuit layer 111 of the multilayer circuit structure 110, and each have a first sub-pixel 120R, a second sub-pixel 120G, and a third sub-pixel 120B. For example, the display pixels 120 may be arranged into a pixel array in a direction X (i.e., a first direction) and a direction Y (i.e., a second direction), for example, being arranged into a pixel array of M columns and N rows, where the X direction is not parallel to the Y direction. The first sub-pixel 120R, the second sub-pixel 120G, and the third sub-pixel 120B are electrically connected to the multilayer circuit structure 110. It should be noted that, in this embodiment, 16 display pixels are exemplarily taken as an example for the number of display pixels 120 corresponding to each light-emitting unit 100. In other words, the display pixels 120 of this embodiment may be arranged into a display array of 4 columns and 4 rows, but it is not intended to limit the disclosure to the drawings. In other embodiments, depending on the actual design (e.g., the number of display pixels, the circuit design of the multilayer circuit structure 110, etc.) of the light-emitting unit 100, the number of display pixels 120 on the light-emitting unit 100 may be adjusted to be arranged into, for example, 2 rows and 2 columns, 3 rows and 3 columns, 1 row and 5 columns, 2 rows and 4 columns, or the like.

In the disclosure, each of the display pixels 120 includes the first sub-pixel 120R, the second sub-pixel 120G, and the third sub-pixel 120B. The light emitted by the first sub-pixel 120R, the second sub-pixel 120G, and the third sub-pixel 120B may have different wavelengths. For example, the first sub-pixel 120R is adapted for emitting red light, the second sub-pixel 120G is adapted for emitting green light, and the third sub-pixel 120B is adapted for emitting blue light. Nonetheless, the disclosure is not limited thereto. The first sub-pixel 120R, the second sub-pixel 120G, the third sub-pixel 120B, and the compensation pixel 130 may be micro light-emitting diodes (micro-LEDs) or mini-LEDs, but the disclosure is not limited thereto.

With reference to FIG. 2, the light-emitting unit 100 of this embodiment also includes the protective layer 140 and the protective board 150. The protective layer 140 is disposed between the multilayer circuit structure 110 and the protective board 150, and covers part of the surface of the multilayer circuit structure 110, the sub-pixels 120R, 120G, 120B, and the compensation pixel 130. The material of the protective layer 140 includes an optical clear adhesive (OCA), an optical clear resin (OCR), or other suitable optical-grade adhesive materials. The protective layer 140 is configured to protect the display pixels 120 and the compensation pixel 130 inside the light-emitting unit 100 to be isolated from external pollution and oxygen to prevent oxidation. The protective board 150 is composed of a transparent material, such as a glass or sapphire substrate. Nonetheless, the disclosure is not limited thereto. Here, the protective board 150 may be regarded as a light guide layer, and can evenly mix the light (e.g., red light, green light, and blue light) emitted by the first sub-pixel 120R, the second sub-pixel 120G, and the third sub-pixel 120B located in the same display pixel 120 and the compensation display light emitted by the compensation pixel 130 (this part will be described in the specification later), which helps to improve the uniformity of emitted light of the display pixels 120 and the compensation pixel 130.

With reference to FIG. 1 and FIG. 2 together, the light-emitting unit 100 of this embodiment also includes the compensation pixel 130 configured to emit compensation display light. The compensation pixel 130 is disposed on the top circuit layer 111 of the multilayer circuit structure 110, and is located between the display pixels 120. In addition, in the pixel array of M columns and N rows formed by the arrangement of the display pixels 120, extension lines in the arrangement directions of the display pixels 120 do not pass the compensation pixel 130. In other words, the compensation pixel 130 is not located in the arrangement direction of two adjacent display pixels 120, but is located on a geometric center of four display pixels 120 in FIG. 1. In this embodiment, the compensation pixel 130 is also located on a geometric center of the light-emitting unit 100. Compared with arranging a plurality of compensation pixels on the same column or same row of the display pixels, in this embodiment, one compensation pixel 130 is disposed on the geometric center of the light-emitting unit 100, which not only increases the uniformity of the compensation display light in the display screen, but also reduces the number of used light-emitting elements and the number of driving chips in the compensation pixel 130 to reduce the costs, and reduces the complexity of circuit design.

With corresponding reference to FIG. 1, FIG. 2, and FIG. 8, the light-emitting unit 100 includes the multilayer circuit structure 110, the display pixels 120, and the compensation pixel 130, and is electrically bonded to other elements through a bottom circuit layer 112 of the multilayer circuit structure 110. More specifically, a display apparatus 10 in the disclosure in FIG. 8 may achieve displaying through a plurality of light-emitting units spliced with each other. Here, only the splicing of the light-emitting unit 100 of the first embodiment of the disclosure is taken as an example for exemplary description, but the disclosure is not limited thereto.

With continued reference to FIG. 8, the display apparatus 10 also includes a driving circuit substrate 200. The driving circuit substrate 200 includes at least one driving chip IC. In this embodiment, the first sub-pixel 120R, the second sub-pixel 120G, and the third sub-pixel 120B on the light-emitting unit 100 may receive a first display signal V1 provided by the driving chip IC, and the compensation pixel 130 may receive a second display signal V2 provided by the driving chip IC. In other words, a luminous intensity of each of the sub-pixels 120R, 120G, 120B and the compensation pixel 130 of the disclosure may be individually controlled through the driving circuit substrate 200 electrically connected to the multilayer circuit structure 110, and then through the at least one driving chip IC included on the driving circuit substrate 200 according to the image screen to be presented.

For example, the multilayer circuit structure 110 may be wire redistribution layers stacked alternately, and include a plurality of metal layers (not shown) and a plurality of insulating layers (not shown). One of the metal layers is configured to form a plurality of conductive patterns located in the top circuit layer 111 of the multilayer circuit structure 110, another one of the metal layers is configured to form a plurality of pad patterns located in the bottom circuit layer 112 of the multilayer circuit structure 110, and still another one of the metal layers is configured to form a plurality of transfer patterns. The transfer patterns may be electrically connected to the conductive patterns and the pad patterns through a plurality of contact holes of the insulating layers. In other words, the metal layers may form a plurality of conductive paths that are electrically insulated from each other between the top circuit layer 111 and the bottom circuit layer 112 of the multilayer circuit structure 110. The first sub-pixels 120R, the second sub-pixels 120G, the third sub-pixels 120B, and the compensation pixels 130 bonded to the conductive patterns located in the top circuit layer 111 of the multilayer circuit structure 110 may be electrically connected to the pad patterns located in the bottom circuit layer 112 of the multilayer circuit structure 110 through the conductive paths. The light-emitting unit 100 may be electrically bonded to the driving circuit substrate 200 through the pad patterns. In other words, the driving circuit substrate 200 includes at least one driving circuit chip IC. The driving circuit chip IC has, for example, transistors or integrated circuits (ICs), and may be electrically connected to the first sub-pixels 120R, the second sub-pixels 120G, the third sub-pixels 120B, and the compensation pixels 130 to control the display signals of the first sub-pixels 120R, the second sub-pixels 120G, the third sub-pixels 120B, and the compensation pixels 130, which is not limited herein.

Then, with reference to FIG. 1, a smallest pitch present between the compensation pixel 130 and the adjacent sub-pixels 120R, 120G, and 120B is X (i.e., a distance between a geometric center of the compensation pixel 130 and a geometric center of the closest one of the sub-pixels 120R, 120G, and 120B to the compensation pixel 130 is X). A pitch present between adjacent ones of the sub-pixels 120R, 120G, and 120B in the display pixels 120 is Y (i.e., a distance between geometric centers of adjacent ones of the sub-pixels 120R, 120G, and 120B is Y). A pitch between adjacent display pixels 120 is Z (i.e., a distance between geometric centers of adjacent display pixels 120 is Z). Here, X, Y, and Z satisfy the following relationship: $Y \leq X < Z$, and $X \leq 0.5$ mm. Since the smallest pitch X between the compensation pixel 130 and the sub-pixels 120R, 120G, and 120B is greater than or equal to the pitch Y between individual ones of the sub-pixels 120R, 120G, and 120B (i.e., $Y \leq X$), the uniformity of the overall display light of the light-emitting unit 100 can be maintained. In addition, since the smallest pitch between the compensation pixel 130 and the sub-pixels 120R, 120G, and 120B is smaller than the pitch between adjacent display pixels 120 (i.e., $X < Z$), the compensation display light emitted by the compensation pixel 130 may not be excessively obvious and may be not likely to be perceived by the user, and the compensation pixel 130 can still complement colors and increase brightness without affecting the viewing experience. Preferably, when $Y \leq 0.5$ millimeter (mm), a better displaying can be exhibited.

It is worth mentioning that, in this embodiment, a luminous intensity of the compensation pixel 130 is less than or equal to a luminous intensity of individual ones of the sub-pixels 120R, 120G, and 120B in the display pixels 120. This design can not only increase the uniformity of the overall display screen, but also prevent the compensation display light emitted by the compensation pixel 130 in the display screen from being excessively obvious to be perceived by the user to affect the viewing experience.

With reference to FIG. 1 and FIG. 2, in this embodiment, an orthographic projection area of the compensation pixel 130 in a normal direction of the top circuit layer 111 of the multilayer circuit structure 110 is A1, and an orthographic projection area of one sub-pixel 120R, 120G, or 120B in the normal direction of the top circuit layer 111 of the multilayer circuit structure 110 is A2, where $0.5 \leq (A1/A2) \leq 2$. In other words, the size of the compensation pixel 130 may not be smaller than a half of the size of one sub-pixel 120R, 120G, or 120B, and is not larger than twice the size of one sub-pixel 120R, 120G, or 120B. This design can not only make the compensation pixel 130 not likely to be perceived by the user in the display screen, but also maintain the uniformity of the compensation display light of the compensation pixel 130 in the display screen.

In addition, the compensation pixel 130 may be a single micro-LED or a single mini-LED. The LED structure of the compensation pixel 130 may also be a face-up type LED, a vertical type LED, or a flip-chip type LED. Nonetheless, the disclosure is not limited thereto.

Moreover, the compensation pixel 130 may also be a combination of various different types of light-emitting diodes. For example, the compensation pixel 130 may include combinations of various numbers of light-emitting diodes that emit red light (with a wavelength ranging from 600 nanometer (nm) to 770 nm), light-emitting diodes that emit green light (with a wavelength ranging from 495 nm to 590 nm), and light-emitting diodes that emit blue light (with a wavelength ranging from 420 nm to 495 nm). Furthermore, in the compensation pixel 130, the ratio of the numbers of various different light-emitting diodes may be correspondingly adjusted as required.

For example, since the human eye has a relatively high sensitivity to green light, the ratio of the number of green light diodes may be increased in the compensation pixel 130. For example, in the compensation pixel 130 in an embodiment, the ratio of the numbers of red light emitting diodes, green light emitting diodes, and blue light emitting diodes may be 1:2:1. This design can achieve a better complementary color and improve brightness.

In the compensation pixel 130 in an embodiment, the ratio of the numbers of red light emitting diodes, green light emitting diodes, and blue light emitting diodes may be 1:1:1. Since each of the light-emitting diodes has the same number, the number of used light-emitting diodes in the compensation pixel 130 can be reduced to reduce the overall costs.

In the compensation pixel 130 in an embodiment, the ratio of the numbers of red light emitting diodes, green light emitting diodes, and blue light emitting diodes may also be 3:1:1. Due to the greater number of red light emitting diodes, the red light can be strengthened to increase the color temperature of the overall display screen.

In the compensation pixel 130 in an embodiment, the ratio of the numbers of red light emitting diodes, green light emitting diodes, and blue light emitting diodes may also be 2:2:1, so the current originally concentrated at the red light-emitting diodes may be dispersed to the green light-emitting diodes, or the current supposed to be transmitted to the first sub-pixel 120R may be provided to the compensation pixel 130 to share the emission of red light, compared with the design of the ratio of the numbers of red light emitting diodes, green light emitting diodes, and blue light emitting diodes being 3:1:1. All of the above-mentioned can achieve dispersion of current. Further, dispersion of hot spots of the light-emitting diodes can be achieved, so that individual pixels are less likely to have an excessive thermal efficiency due to an excessive high current. Further, in the pixels of the disclosure, the service life of the light-emitting diodes is not likely to be reduced because of high temperature.

In the compensation pixel 130 in an embodiment, the ratio of the numbers of red light emitting diodes, green light emitting diodes, and blue light emitting diodes may also be 3:2:1. By this design, the compensation pixel 130 can have a wider color gamut, and the color purity of the display image can also be adjusted. The above-mentioned ratios are only exemplary. Those skilled in the art may adaptively adjust the ratio of the numbers of light-emitting diodes in the compensation pixel 130 as required, and the disclosure is not limited thereto.

With corresponding reference to FIG. 2, the compensation pixel 130 and the sub-pixels 120R, 120G, and 120B of this embodiment each emit light in a direction away from the multilayer circuit structure 110. It is worth mentioning that a light-emitting angle θ1 of the compensation pixel 130 is greater than a light-emitting angle θ2 of individual ones of the sub-pixels 120R, 120G, and 120B. By this design, the light-emitting angle of the compensation display light emitted by the compensation pixel 130 can be increased, further increasing the compensation for the display screen. In addition, an optical microstructure 131 may also be disposed in the direction of the compensation pixel 130 facing away from the multilayer circuit structure 110. The optical microstructure 131 may be an optical micro lens, and is configured to further improve the light-emitting angle θ1 or the light shape of the compensation pixel 130. Moreover, the optical microstructure 131 may also be a wavelength conversion structure, such as a quantum dot structure. The light-emitting diode chip may be changed into wavelengths of different light colors by the wavelength conversion structure to further adjust the utilization rate of various light-emitting diode chips, and increase the use flexibility of various light-emitting diodes to achieve inventory adjustment.

In addition, the compensation pixel 130 has a first thickness T1 in the multilayer circuit structure 110 (in a Z direction in FIG. 1). The sub-pixels 120R, 120G, and 120B have a second thickness T2 in the multilayer circuit structure 110 (in the Z direction in FIG. 1). The first thickness T1 is less than or equal to the second thickness T2. Preferably, the first thickness T1 is less than the second thickness T2. By this design, the difference of the compensation display light of the compensation pixel 130 in the display screen can be not likely to be perceived, and thus the viewing experience of the user is not affected.

In summary of the foregoing, the light-emitting unit 100 of this embodiment provides compensation display light through the compensation pixel 130, so even in an environment with an excessively bright external light source, the display screen can still have good contrast, brightness, and color purity. As such, the display apparatus that includes the light-emitting unit 100 of this embodiment can still provide good display quality when applied in an environment with excessive external light. In addition, since the number of compensation pixels 130 in the light-emitting unit 100 is less than the number of display pixels 120, the complexity of circuit design and the number of used light-emitting devices in the display pixels are accordingly reduced, thus reducing the costs.

Figure 3:
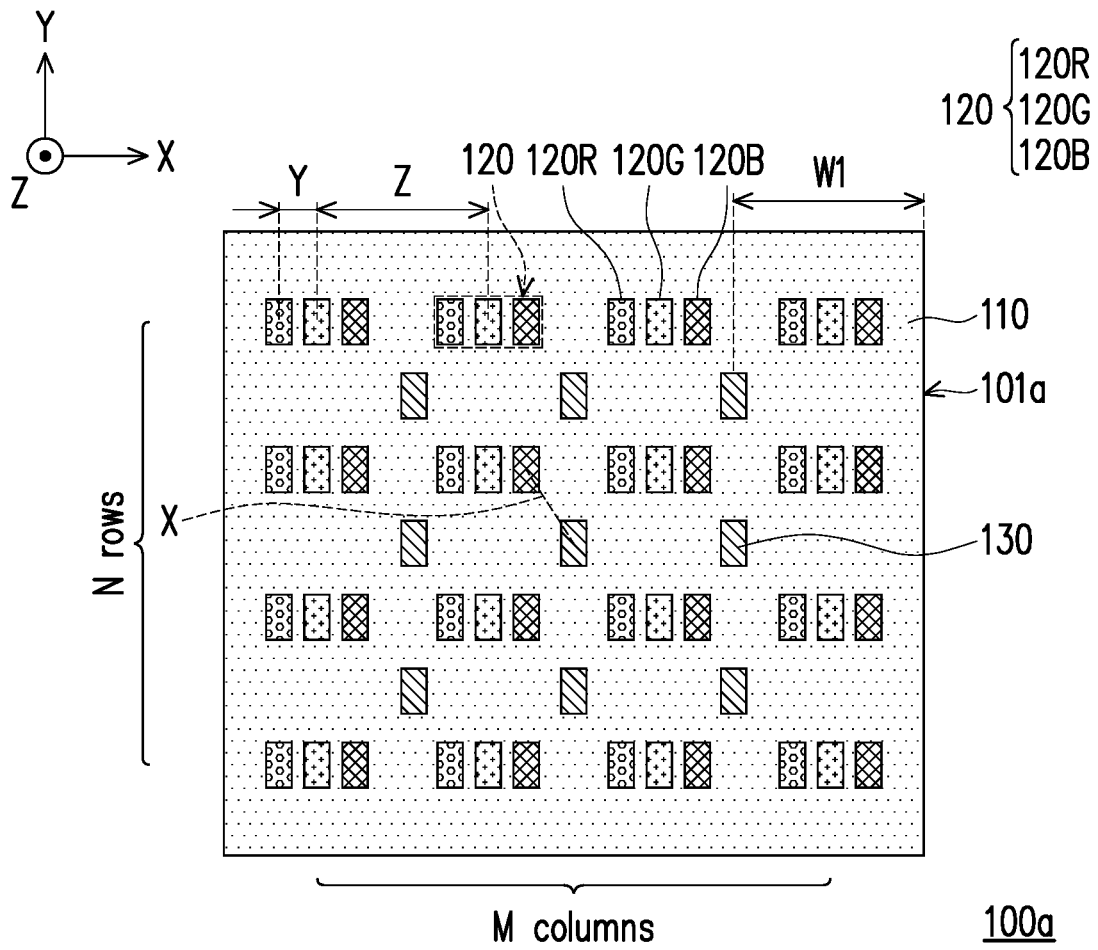
FIG. 3 is a schematic top view of a light-emitting unit according to a second embodiment of the disclosure.

FIG. 3 is a schematic top view of a light-emitting unit according to a second embodiment of the disclosure. With reference to FIG. 3, a light-emitting unit 100a of this embodiment is similar to the light-emitting unit 100 of FIG. 1, and is different in that the light-emitting unit 100a includes a plurality of compensation pixels 130. In the second embodiment shown in FIG. 3, the compensation pixels 130 are arranged into a P×Q array, and a geometric center of the P×Q array and a geometric center of the N×M pixel array formed by the arrangement of the display pixels 120 are the same, where P<N, and Q<M. In other words, the number of the compensation pixels 130 in this embodiment is less than the number of the display pixels 120, where P=Q=3, and N=M=4. Nonetheless, the disclosure is not limited thereto. In this embodiment and other embodiments not shown, the values of P and Q may satisfy the following relationship: 2≤P<N, and 2≤Q<M, where P, Q, N, and M are positive integers. Preferably, a ratio of the number of the compensation pixels 130 to the number of the sub-pixels 120R, 120G, and 120B is less than or equal to 0.25. Accordingly, the design of a plurality of compensation pixels 130 can not only provide compensation display light, but also further increase the uniformity of the display screen, and can reduce the difficulty in circuit design for the multilayer circuit structure 110. Preferably, in this embodiment, the geometric center of the P×Q array formed by the arrangement of the compensation pixel 130, the geometric center of the N×M pixel array formed by the arrangement of the display pixels 120, and a geometric center of the light-emitting unit 100a are all the same. Nonetheless, the disclosure is not limited thereto.

With continued reference to FIG. 3, the light-emitting unit 100a of this embodiment has an edge 101a. A smallest distance W1 from the compensation pixels 130 to the edge 101a of the light-emitting unit 100a is greater than the pitch Z between adjacent display pixels 120. By controlling the smallest distance W1 from the compensation pixels 130 to the edge 101a of the light-emitting unit 100a, during the process of splicing the light-emitting unit 100a with another light-emitting unit 100a, the compensation display light emitted by the compensation pixel 130 may not be excessively concentrated at the edge 101a of the light-emitting unit 100a, so that the compensation display light may not be excessively concentrated at the splice between the adjacent light-emitting units 100a and cause the splice to be excessively obvious, reducing the sense of discontinuity of the display screen.

Since the configuration of the other elements of the light-emitting unit 100a of this embodiment is similar to that of the light-emitting unit 100 of FIG. 1 and FIG. 2, reference may be made to the relevant paragraphs in the above embodiments for the detailed description and similar effects, which will not be repeatedly described here.

Figure 4:
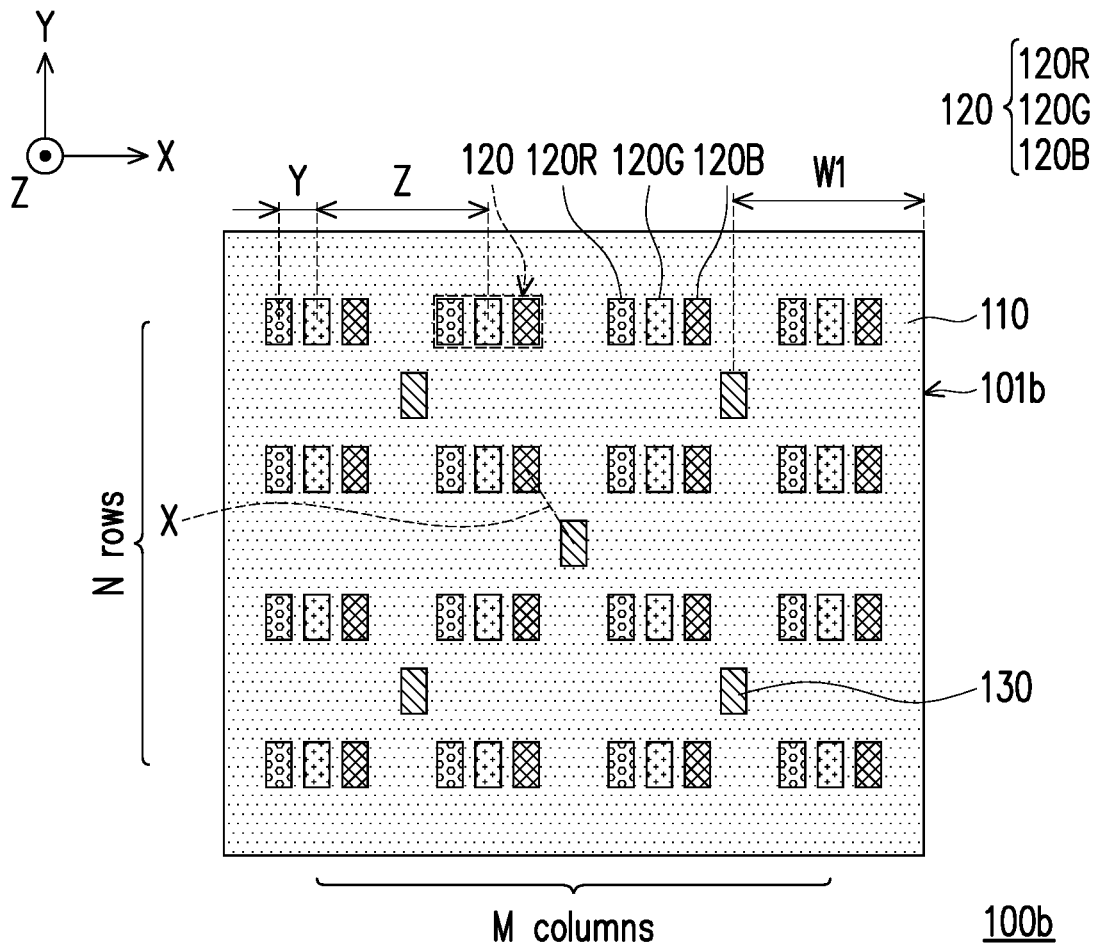
FIG. 4 is a schematic top view of a light-emitting unit according to a third embodiment of the disclosure.

FIG. 4 is a schematic top view of a light-emitting unit according to a third embodiment of the disclosure. With reference to FIG. 4, a light-emitting unit 100b of this embodiment is similar to the light-emitting unit 100a of FIG. 3, and is different in that the arrangement of the compensation pixels 130 of the light-emitting unit 100b is different. In the third embodiment shown in FIG. 4, the compensation pixel 130 is disposed in diagonals of the N×M pixel array formed by the arrangement of the display pixels 120. In other words, the compensation pixels 130 of this embodiment are arranged into an X-shaped array on the top view of the light-emitting unit 100b of FIG. 4. Preferably, a geometric center of the X-shaped array of the compensation pixels 130, the geometric center of the N×M pixel array of the display pixels 120, and a geometric center of the light-emitting unit 100b are all the same. Nonetheless, the disclosure is not limited thereto.

Compared with the design of the light-emitting unit 100a, the light-emitting unit 100b of this embodiment can further reduce the number of used compensation pixels 130, and achieves providing compensation display light by the compensation pixels 130. In addition, the configuration of the compensation pixels 130 in the diagonals of the N×M pixel array can maintain the uniformity of the compensation display light in the display screen without affecting the viewing experience of the user.

Since the configuration of the other elements of the light-emitting unit 100b of this embodiment is similar to that of the light-emitting unit 100a of FIG. 3, reference may be made to the relevant paragraphs in the above embodiments for the detailed description and other similar effects, which will not be repeatedly described here.

Figure 5:
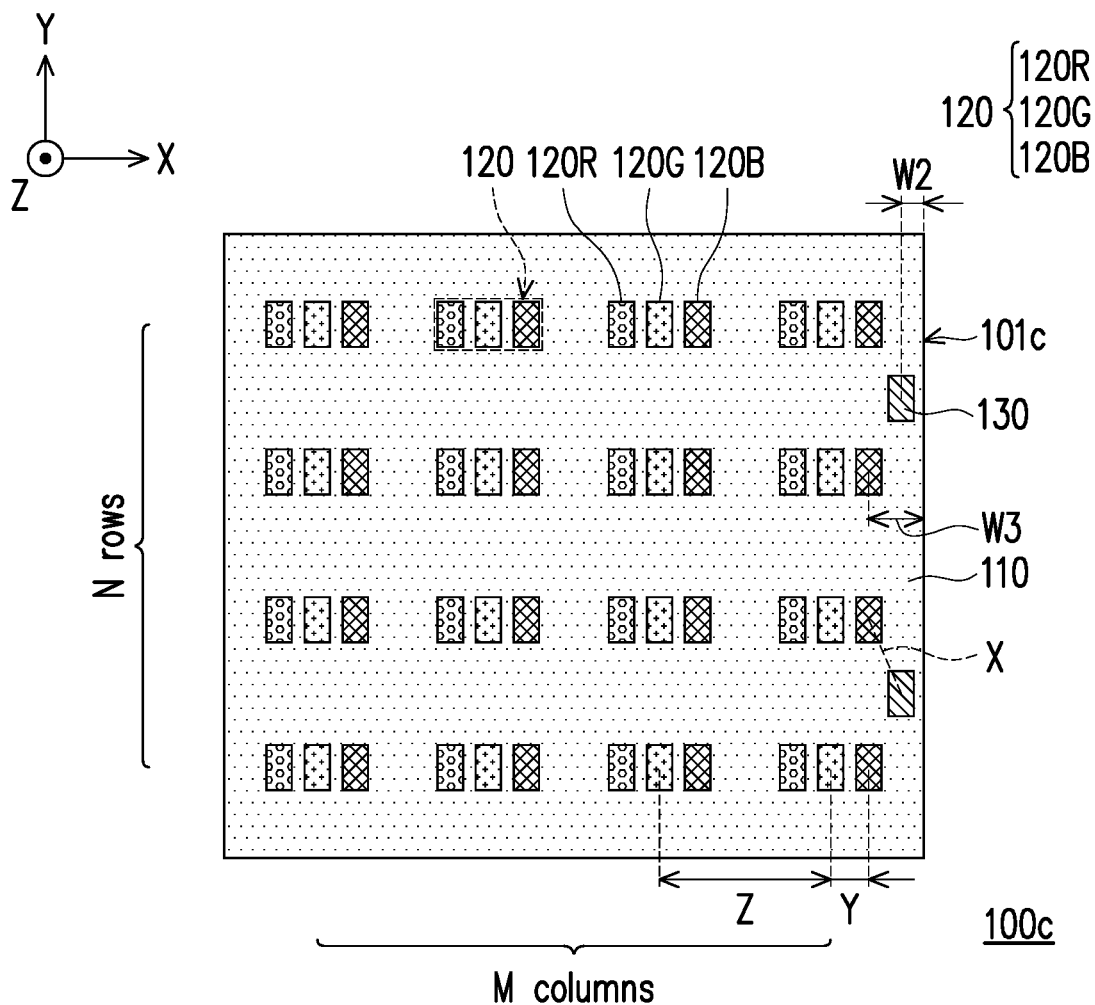
FIG. 5 is a schematic top view of a light-emitting unit according to a fourth embodiment of the disclosure.
Figure 6:
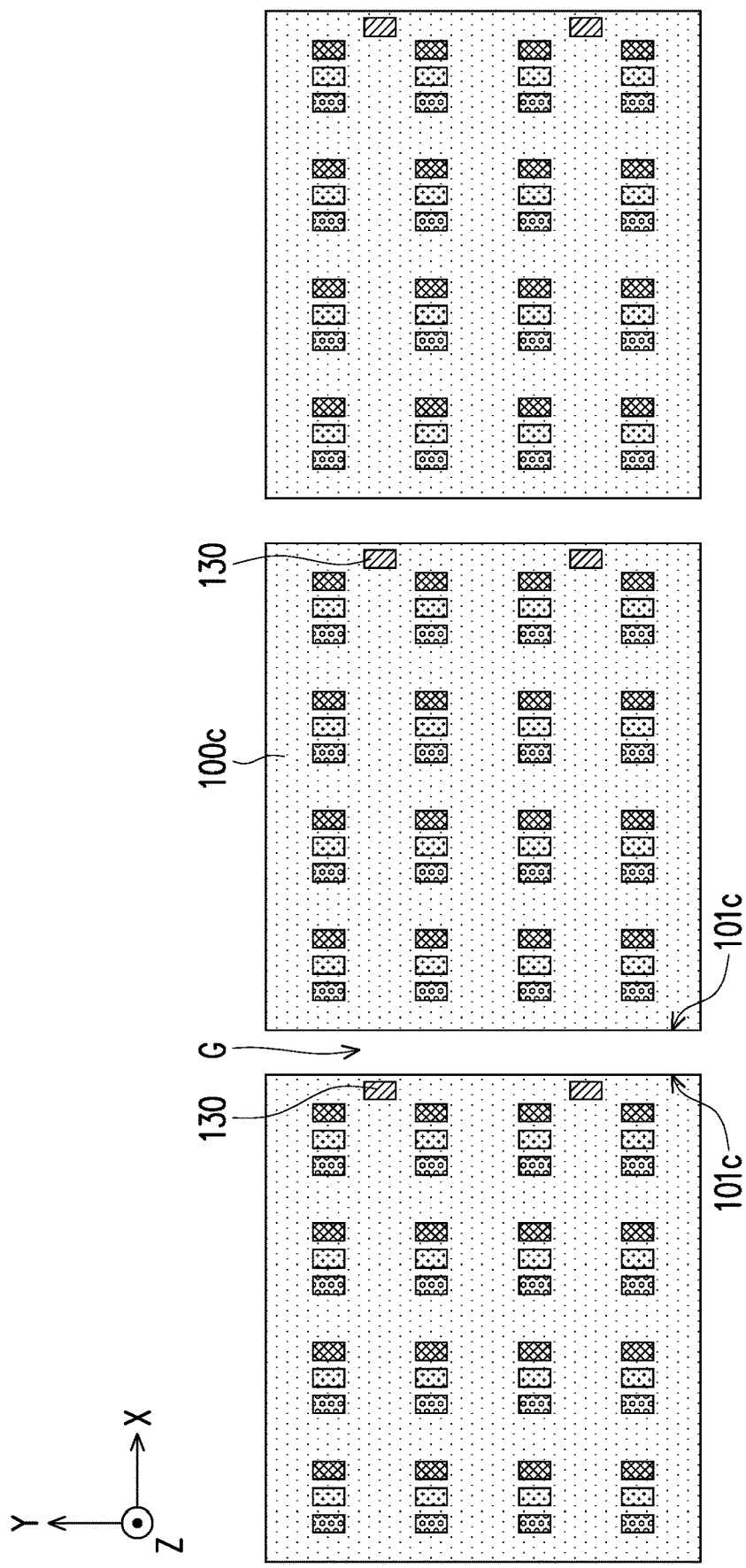
FIG. 6 is a schematic top view of splicing light-emitting units according to a fourth embodiment of the disclosure.

FIG. 5 is a schematic top view of a light-emitting unit according to a fourth embodiment of the disclosure. FIG. 6 is a schematic top view of splicing light-emitting units according to a fourth embodiment of the disclosure. First, with reference to FIG. 5, a light-emitting unit 100c of this embodiment is similar to the light-emitting unit 100a of FIG. 3, and is different in that the arrangement of the compensation pixels 130 of the light-emitting unit 100c is different, and a smallest distance between the compensation pixels 130 and an edge 101c of the light-emitting unit 100c is different from that of the light-emitting unit 100a. In this embodiment, a distance W2 from the compensation pixels 130 to the edge 101c of the light-emitting unit 100c (i.e., the distance W2 from the geometric center of the compensation pixel 130 to the edge 101c of the light-emitting unit 100c) is smaller than a distance W3 from the display pixels 120 to the edge 101c of the light-emitting unit 100c. In other words, in the light-emitting unit 100c of this embodiment, the compensation pixels 130 are arranged to be concentrated on one side of the light-emitting unit 100c of FIG. 5, and each of the compensation pixel 130 is closer to the edge 101c of the light-emitting unit 100c than each of the display pixels 120 is. Although only two compensation pixels 130 are schematically shown In FIG. 5, more compensation pixels 130 may also be present in other embodiments, and the disclosure is not limited thereto.

FIG. 6 is a schematic view of splicing the light-emitting units 100c of this embodiment. With reference to FIG. 6, taking this embodiment as an example, since the process of splicing and transferring the light-emitting units 100c to form a display apparatus requires extremely high accuracy, accurate alignment after the transfer may not be completely possible. Therefore, when the light-emitting units 100c are electrically bonded to a display substrate (e.g., the driving circuit substrate 200 shown in FIG. 8), a gap G is likely to exist between the light-emitting units 100c. Since the sub-pixels 120R, 120G, and 120B do not exist in the vicinity of the gap G and the edge 101c of the light-emitting unit 100c, the brightness in the vicinity of the gap G is less than the brightness in the vicinity of a geometric center of the light-emitting unit 100c. In other words, the existence of the gap G causes a visual sense of image discontinuity to likely occur in the display image of the light-emitting units 100c.

In view of the above, the compensation pixels 130 of the light-emitting unit 100c are only concentrated on one side of the edge 101c, and the compensation pixels 130 are closer to the edge 101c of the light-emitting unit 100c than each of the display pixels 120 is. Between adjacent light-emitting units 100c, by concentrating compensate display light of the compensation pixels 130 at the edge 101c, the visibility of the gap G can be effectively reduced. In other words, the visual sense of image discontinuity occurring in the display image of the light-emitting units 100c due to the gap G can be improved, thus improving the display quality of the display apparatus.

Similarly, the compensation pixels 130 of the light-emitting unit 100c are not limited to being concentrated on the left and right sides (e.g., in the X direction or −X direction in FIG. 6) of the light-emitting unit 100c in FIG. 6. In some embodiments not shown, the compensation pixels 130 may also be concentrated on the upper and lower sides (e.g., in the Y direction or −Y direction) of the light-emitting unit 100c in FIG. 6. In all of the above embodiments, the visibility of the gap G can be reduced by utilizing the compensation pixels 130 concentrated on one side. Nonetheless, the disclosure is not limited thereto. It is worth mentioning that the compensation pixels 130 may be prevented from being concentrated on two adjacent sides of the light-emitting units 100c at the same time to prevent the compensation display light from being excessively obvious to be perceived.

Since the configuration of the other elements of the light-emitting unit 100c of this embodiment is similar to that of the light-emitting unit 100a of FIG. 3, reference may be made to the relevant paragraphs in the above embodiments for the detailed description and other similar effects, which will not be repeatedly described here.

Figure 7:
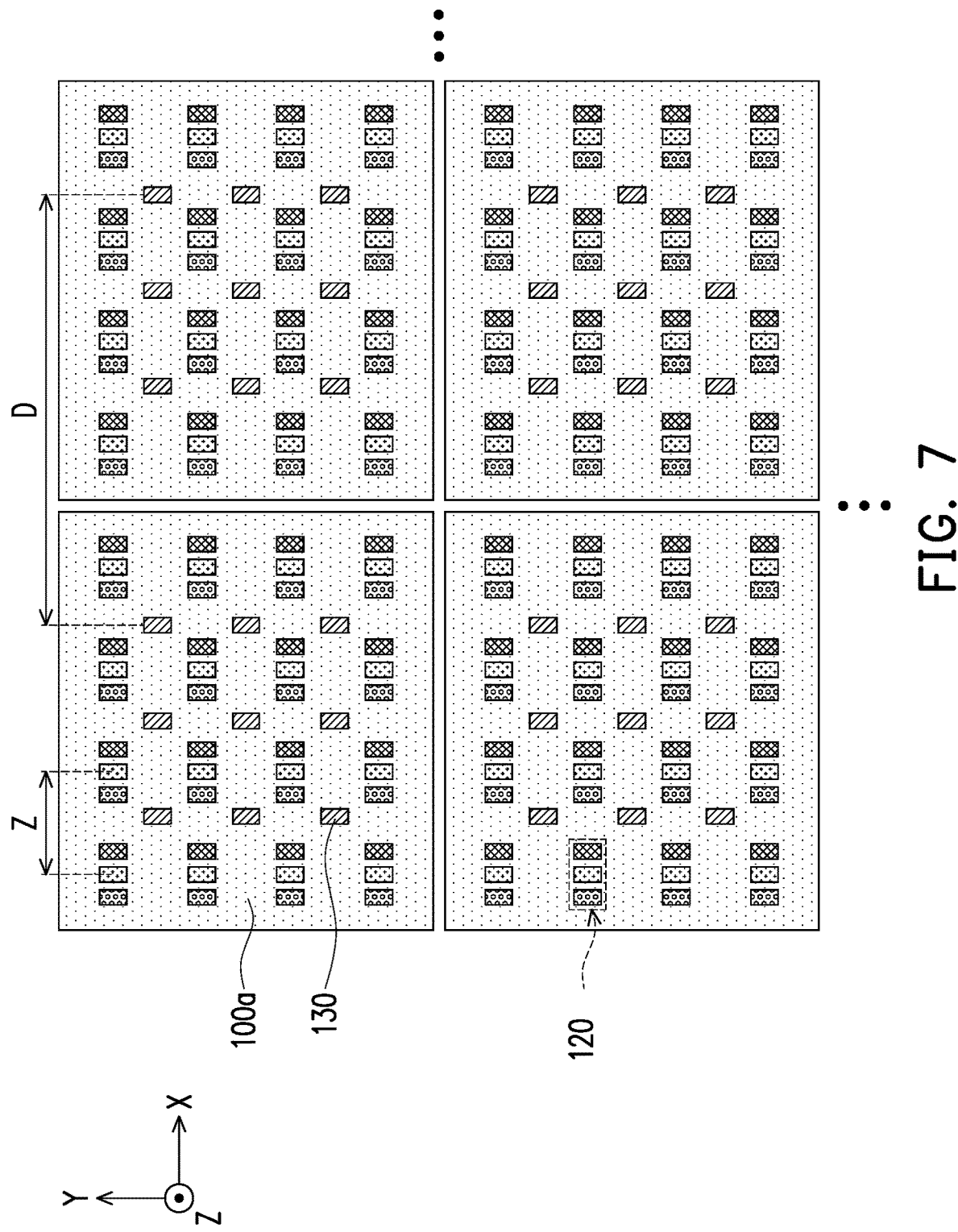
FIG. 7 is a top view of splicing light-emitting units of the disclosure.

FIG. 7 is a top view of splicing light-emitting units of the disclosure. With reference to FIG. 7, FIG. 7 schematically shows a process of splicing the light-emitting units 100a, but it is also applicable to a process of splicing the light-emitting units 100 or the light-emitting units 100b, and the disclosure is not limited thereto. In adjacent light-emitting units 100a in FIG. 7, a repetition period D of the compensation pixels 130 is greater than the pitch Z of the adjacent display pixels 120, and the period D of the compensation pixels is greater than 0.5 mm. During the process of splicing, the compensation pixels 130 of each light-emitting unit 100a are required to be at positions with the same cycle of period to achieve the uniformity of the display image and the consistency of the compensation display light.

FIG. 8 is a schematic cross-sectional view of a display apparatus formed by splicing the light-emitting units of the disclosure. The display apparatus 10 in FIG. 8 includes the light-emitting units 100, the driving circuit substrate 200, a light-transmitting layer 300, and a cover 400. In FIG. 8, only three light-emitting units 100 and a display apparatus 10 formed by splicing the light-emitting units 100 are schematically shown. Nonetheless, the display apparatus 10 may also be formed by splicing the light-emitting units 100a, the light-emitting units 100b, or the light-emitting units 100c of other embodiments of the disclosure and other light-emitting units obtained from the embodiments of the disclosure, and the disclosure is not limited thereto. By first bonding the light-emitting elements to the light-emitting units 100, and then splicing and transferring the light-emitting units 100 to the driving circuit substrate 200 to form the display apparatus 10, the development advantages of mass transfer technology in the manufacturing of large-size products can be increased. Since the bonding of the driving circuit substrate 200 and the multilayer circuit structure 110 of the light-emitting unit 100 has been described in detail in the above paragraphs of the specification, reference may be made to the above paragraphs, which will not repeatedly described here.

In addition, the light-transmitting layer 300 is disposed on the light-emitting units 100, and is filled in the gap G between the light-emitting units 100. The light-transmitting layer 300 of the disclosure may be a resin material or other suitable filling materials. The light-transmitting layer 300 may also be the same material as the protective layer 140 to reduce the number of steps in the process. Similarly, the cover 400 is composed of a transparent material, and may also be the same material as the protective board 150. Nonetheless, the disclosure is not limited thereto. Similarly, reference may be made to the above paragraphs for the functions of relevant elements, which will not be repeatedly described here. Subsequently, the display apparatuses may also be combined and spliced into a larger-size display panel, so that the display panel may adaptively adjust the brightness of the compensation pixel for compensation depending on the environment, improving the display quality, particularly for an outdoor display panel with high brightness requirements.

Moreover, the disclosure provides a solution to uneven brightness of the display apparatus. When the display apparatus leaves the factory, the display apparatus may first be lit by the driving circuit to start displaying different images. Then, different detection means, for example, high-resolution and high-precision charge-coupled device (CCD) photographic inspection, are used. First, according to the current target brightness of the display pixels 120, the compensation brightness that should be used in the current display is calculated and analyzed. Then, the compensation pixel 130 is controlled to emit compensation display light to compensate for brightness, and calculations of the overall display brightness of each time are continuously repeated and iterated until the target brightness is reached. Accordingly, the uneven brightness of the display apparatus caused by process defects can be effectively reduced because of the compensation pixel 130.

Furthermore, since the display apparatus 10 of the disclosure has an independently controllable compensation pixel 130, by the compensation display light emitted by the compensation pixel 130, the display apparatus 10 of the disclosure can adaptively increase the brightness of a partial region in the display screen, achieving partial brightening of the display screen. With the above, the contrast between bright and dark regions in the display screen is further increased to enhance the contrast of the display screen and improve the viewing experience of the user.

Based on the foregoing, in the light-emitting unit and the display apparatus of an embodiment of the disclosure, since the compensation pixel provides compensation display light, the display screen can still have good contrast, brightness, and color purity even when the display apparatus is in an environment with an excessively bright external light source, so that the display apparatus of the disclosure still has good display quality even when the environmental light is excessively bright. In addition, the difficulty in manufacturing a large-size display apparatus is reduced by the spliced light-emitting units. At the same time, the visual discontinuity of the image is reduced by utilizing the compensation display light emitted by the compensation pixel. Moreover, since the number of compensation pixels is less than the number of display pixels, the complexity of circuit design and the amount of usage of the light-emitting elements are accordingly reduced, thus reducing the costs. Furthermore, since the compensation pixel may be individually modulated, the display apparatus can thus adaptively adjust the brightness of the compensation pixel for compensation depending on the environment, so that the bright region of the display screen have a relatively high brightness, accordingly effectively reducing the influence of uneven brightness of the display screen.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting unit, comprising:
a multilayer circuit structure comprising a top circuit layer and a bottom circuit layer disposed opposite to the top circuit layer;
a plurality of display pixels arranged into an N×M pixel array along a first direction and a second direction, wherein each of the display pixels comprises a plurality of sub-pixels, the sub-pixels are disposed on the top circuit layer of the multilayer circuit structure, and the first direction is not parallel to the second direction; and
at least one compensation pixel disposed on the top circuit layer of the multilayer circuit structure and electrically bonded to the multilayer circuit structure, wherein the at least one compensation pixel is located between the display pixels, the number of the at least one compensation pixel is less than the number of the display pixels, and an extension line in the first direction and an extension line in the second direction do not pass through the at least one compensation pixel.

2. The light-emitting unit according to claim 1, wherein the at least one compensation pixel comprises one compensation pixel, and the compensation pixel is located in a geometric center of the light-emitting unit.

3. The light-emitting unit according to claim 1, wherein the at least one compensation pixel comprises a plurality of compensation pixels, the compensation pixels are arranged into a P×Q array, and a geometric center of the P×Q array is the same as a geometric center of the N×M pixel array, where P<N, and Q<M.

4. The light-emitting unit according to claim 1, wherein the at least one compensation pixel comprises a plurality of compensation pixels, and a distance from the compensation pixels to an edge of the light-emitting unit is smaller than a distance from the display pixels to the edge of the light-emitting unit.

5. The light-emitting unit according to claim 1, wherein a smallest pitch between the at least one compensation pixel and an adjacent one of the sub-pixels is X, a pitch between adjacent ones of the sub-pixels in the display pixels is Y, and a pitch between adjacent ones of the display pixels is Z, where $Y \leq X < Z$, and $X \leq 0.5$ mm.

6. The light-emitting unit according to claim 5, wherein a smallest distance from the at least one compensation pixel to an edge of the light-emitting unit is greater than Z.

7. The light-emitting unit according to claim 1, wherein a brightness of the at least one compensation pixel is less than a brightness of the sub-pixels.

8. The light-emitting unit according to claim 1, wherein the at least one compensation pixel comprises a plurality of compensation pixels, and a ratio of the number of the compensation pixels to the number of the sub-pixels is ≤0.25.

9. The light-emitting unit according to claim 1, wherein an orthographic projection area of one of the at least one compensation pixel in a normal direction of the top circuit layer is A1, and an orthographic projection area of one of the sub-pixels in the normal direction of the top circuit layer is A2, where $0.5 \leq (A1/A2) \leq 2$.

10. The light-emitting unit according to claim 1, wherein the sub-pixels and the at least one compensation pixel emit light in a direction away from the multilayer circuit structure, and a light-emitting angle of the at least one compensation pixel is greater than a light-emitting angle of the sub-pixels.

11. The light-emitting unit according to claim 1, wherein the at least one compensation pixel has a first thickness, the sub-pixels have a second thickness, and the first thickness is less than or equal to the second thickness.

12. A display apparatus adapted for splicing, the display apparatus comprising:
- a plurality of light-emitting units, wherein adjacent ones of the light-emitting units are connected to each other, and each of the light-emitting units comprises:
  - a multilayer circuit structure comprising a top circuit layer and a bottom circuit layer disposed opposite to the top circuit layer;
  - a plurality of display pixels arranged into an N×M pixel array along a first direction and a second direction, wherein each of the display pixels comprises a plurality of sub-pixels, the sub-pixels are disposed on the top circuit layer of the multilayer circuit structure, and the first direction is not parallel to the second direction; and
  - at least one compensation pixel disposed on the top circuit layer of the multilayer circuit structure and electrically bonded to the multilayer circuit structure, wherein the at least one compensation pixel is located between the display pixels, the number of the at least one compensation pixel is less than the number of the display pixels, and an extension line in the first direction and an extension line in the second direction do not pass through the at least one compensation pixel; and
- a driving circuit substrate electrically bonded to the bottom circuit layer of the multilayer circuit structure and electrically bonded to the display pixels and the at least one compensation pixel through the multilayer circuit structure, wherein the driving circuit substrate comprises at least one driving chip, and the at least one driving chip provides a first display signal to the sub-pixels and a second display signal to the at least one compensation pixel.

13. The display apparatus according to claim 12, wherein the first display signal is different from the second display signal.

14. The display apparatus according to claim 12, wherein in adjacent ones of the light-emitting units, a period of the at least one compensation pixel is greater than a pitch between the display pixels, and the period of the at least one compensation pixel is greater than 0.5 mm.

* * * * *